(12) United States Patent
Tillman

(10) Patent No.: US 11,243,103 B1
(45) Date of Patent: Feb. 8, 2022

(54) DRAIN MONITOR, SYSTEM AND METHOD OF ITS USE

(71) Applicant: Kevin W. Tillman, Coweta, OK (US)

(72) Inventor: Kevin W. Tillman, Coweta, OK (US)

(*) Notice: Subject to any disclaimer, the term of this patent is extended or adjusted under 35 U.S.C. 154(b) by 82 days.

(21) Appl. No.: 16/935,883

(22) Filed: Jul. 22, 2020

Related U.S. Application Data

(60) Provisional application No. 62/945,907, filed on Dec. 10, 2019.

(51) Int. Cl.
*G01F 1/56* (2006.01)
*G01R 1/067* (2006.01)
*G08B 23/00* (2006.01)

(52) U.S. Cl.
CPC ........... *G01F 1/56* (2013.01); *G01R 1/06766* (2013.01); *G08B 23/00* (2013.01)

(58) Field of Classification Search
CPC ........................................................ G01F 1/56
See application file for complete search history.

(56) References Cited

U.S. PATENT DOCUMENTS

| | | | | |
|---|---|---|---|---|
| 2005/0005711 | A1* | 1/2005 | Gysling | G01F 1/74 73/861.08 |
| 2009/0193908 | A1* | 8/2009 | Dana | F16K 31/084 73/861.08 |
| 2011/0113894 | A1* | 5/2011 | Brill | G01F 1/28 73/861.08 |
| 2012/0029845 | A1* | 2/2012 | Flider | G01N 27/74 702/45 |
| 2013/0112007 | A1* | 5/2013 | Adler | G01F 1/66 73/861.08 |
| 2013/0139608 | A1* | 6/2013 | Gouwens | G01F 1/56 73/861.08 |
| 2015/0198469 | A1* | 7/2015 | Hou | G01F 1/56 73/861.11 |
| 2015/0276450 | A1* | 10/2015 | Yoder | G01F 1/32 73/861.357 |
| 2016/0216139 | A1* | 7/2016 | Adler | E02B 1/00 |
| 2021/0293103 | A1* | 9/2021 | Olsen | E21B 21/08 |

* cited by examiner

Primary Examiner — Travis R Runnings
(74) Attorney, Agent, or Firm — GableGotwals

(57) ABSTRACT

Embodiments of a drain monitor of this disclosure monitors an active, horizontal- or vertical-oriented hose, pipe, or drain and allows a draining liquid to pass through or by the monitor without "alarming" if there is no blockage or stoppage of the drain and alarming if there is a blockage or stoppage of the drain. The monitor may include a housing having an open bottom end, a hollow interior, and a plurality of inclined thru ports providing fluid passage to the interior but preventing a draining liquid flowing past the probe from entering the hollow interior. In some embodiments, the monitor may work in reverse, meaning if the pipe or hose is supposed to have a certain level of liquid, the monitor alarms if the liquid falls below that level. A second monitor may be installed in series with the first, alarming if the liquid rises above a predetermined level.

22 Claims, 3 Drawing Sheets

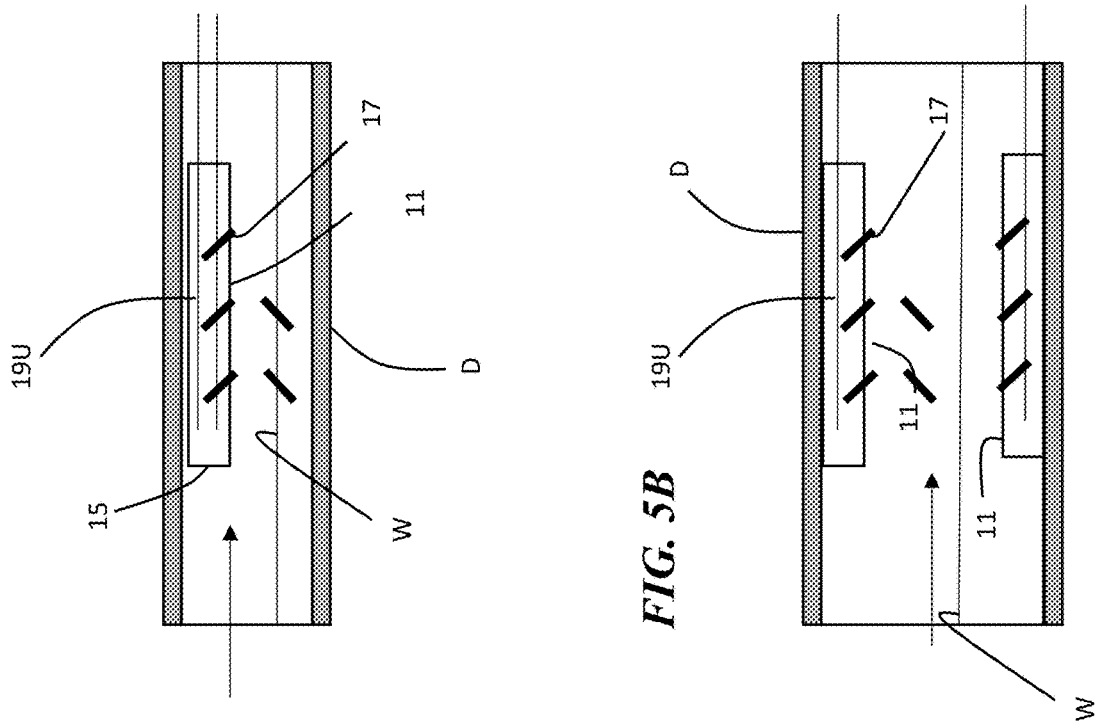
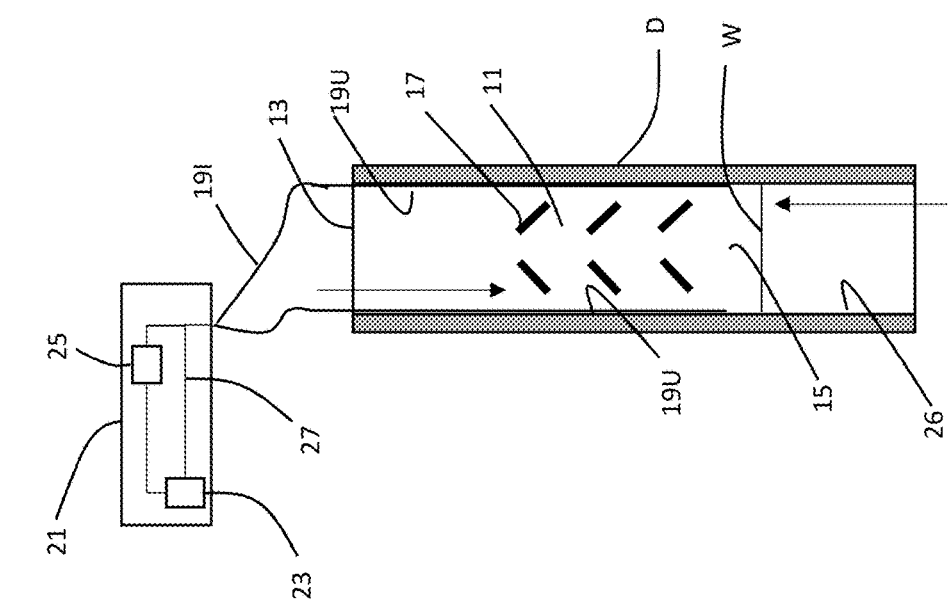

DRAIN MONITOR, SYSTEM AND METHOD OF ITS USE

CROSS-REFERENCE TO APPLICATIONS

This application claims priority to, and the benefit of, U.S. 62/945,907 filed Dec. 10, 2019.

BACKGROUND

This disclosure relates to HVAC and plumbing systems and methods of inspecting and monitoring drains, drain pipes, and drain pans associated with those systems.

SUMMARY

Embodiments of a drain monitor of this disclosure monitors an active, horizontal- or vertical-oriented hose, pipe, or drain and allows a draining liquid to pass through or by the monitor without "alarming" if there is no blockage or stoppage of the drain and alarming if there is a blockage or stoppage of the drain. In some embodiments, the monitor may work in reverse, meaning if the pipe or hose is supposed to have a certain level of liquid, the monitor alarms if the liquid falls below that level. A second monitor may be installed in series with the first, alarming if the liquid rises above a predetermined level.

In embodiments, a drain monitor of this disclosure may be configured as a drain blockage detector. The monitor includes an alarm connected to a probe in an open circuit relationship with one another, the probe including a hollow interior and an open bottom end, a pair of wires having one end connected to the alarm and having another end located within the hollow interior of the probe, at least a portion of each wire located within the hollow interior being an uninsulated portion spaced apart from an uninsulated portion of the other wire of the pair.

BRIEF DESCRIPTION OF THE DRAWINGS

FIG. 4 is another embodiment of a drain monitor of this disclosure. The monitor may be integrated into a drain pipe or hose.

FIG. 5A is a schematic illustrating the use of a single probe in a horizontal orientation.

FIG. 5B is a schematic illustrating the use of two probes in a horizontal orientation. The lower probe may be in water, with the circuit completing when the water level rises to the upper probe.

DETAILED DESCRIPTION

Figure 1:
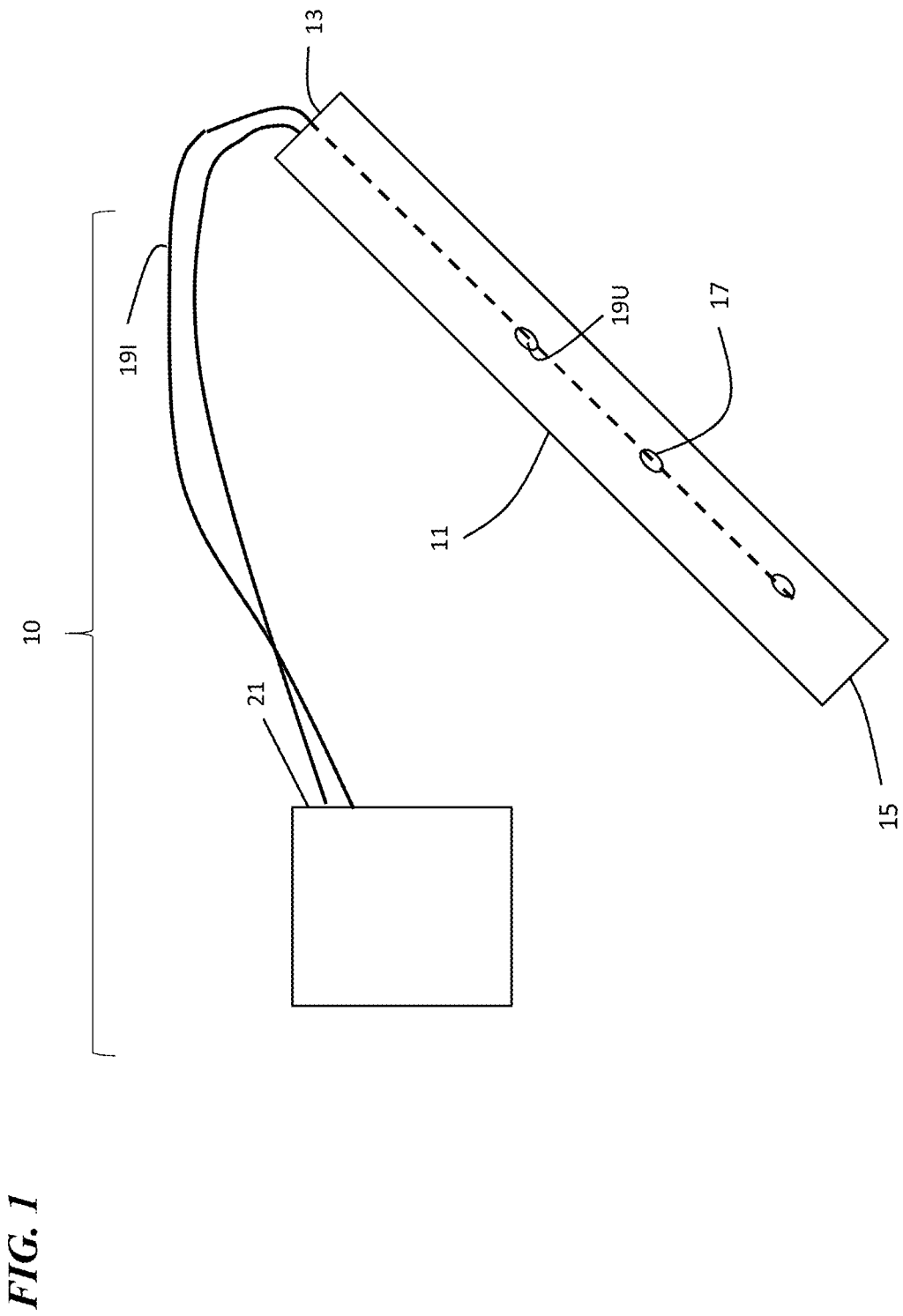
FIG. 1 is an embodiment of a drain monitor of this disclosure.
Figure 3:
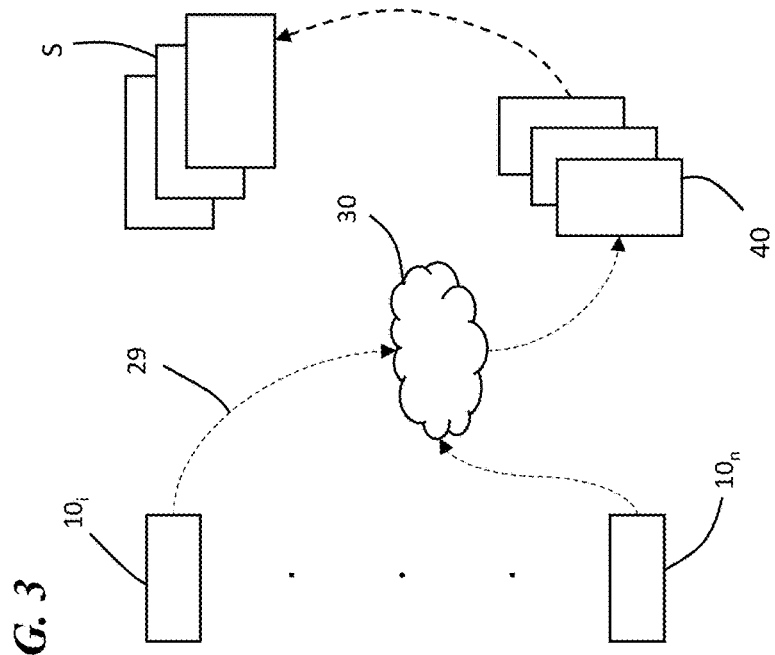
FIG. 3 is a schematic of a system and method of this disclosure.
Figure 2A:
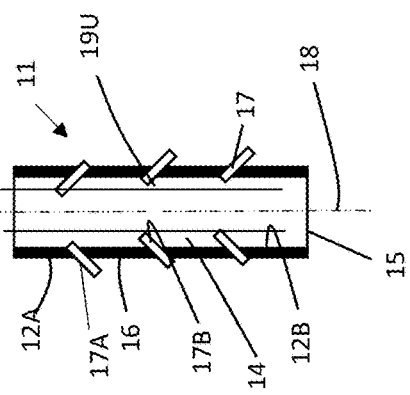
FIG. 2A is a cross-section view of a portion of a probe of this disclosure.
Figure 2:
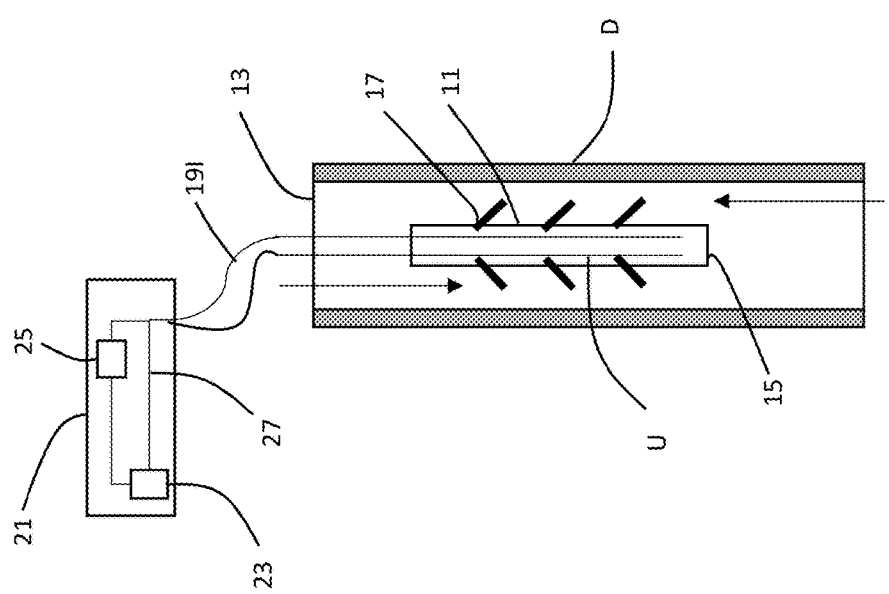
FIG. 2 is a schematic of an embodiment of a drain monitor of this disclosure.

Embodiments of a drain monitor 10 of this disclosure include an alarm 21 connected to a probe 11 including a housing 16 that contains in its interior (hollow) space 14 between the upper end 13 and lower end 15 of the probe 11 a pair of wires 19 including spaced-apart uninsulated conductive portions 19U. Portions 19U run along opposite sides of the centerline 18 of the probe 11. The portions 19U may be spaced a predetermined distance apart from one another and from the lower end 15 of the probe 11. Probe 11 may be generally cylindrical in shape. In some embodiments, probe 11 may include one or more upwardly inclined thru ports 17 arrayed along its length, thereby exposing the uninsulated conductive portions 19U located within the interior space 14 to an environment surrounding the probe 11. The ports 17 extend between the exterior and interior sides or walls 12A, 12B of housing 16, with the interior end 17B of the port 17 being at a higher vertical elevation than its exterior end 17A. The ports 17 form a fluid passageway to the interior space 14. The ports 17 may be in a predetermined pattern or randomly spaced. The ports 17 permit a draining liquid to flow past the probe 11 in a first direction without affecting the normal open or closed state (first state) of the circuit yet permit fluid communication between the interior space 14 and the drain wall when, for example, the drain backs up and the liquid that has passed the probe 11 reverses flows in a second direction opposite that of the first. As the drain backs up, and liquid enters space 14, that liquid comes into contact with liquid that has backed up and into the ports 17. The circuit then moves into its second state (closed or open).

In embodiments of the ports 17, the interior end 17B is upstream and the exterior end 17A is downstream relative to the drain flow direction of the liquid. The incline of the ports 17 prevents liquid from entering the interior space 14 but permits liquid that backs up and enters the open bottom end 15 to drain from the interior space 14. In some embodiments, the ports 17 are located along opposite sides of the housing 16. In other embodiments, the ports 17 are located along one side of the housing 16. For example, the housing 16 may have one side connected to, or formed integral with, a drain pipe wall, there being no ports 17 along the connection.

When in a vertical orientation, water may run down the exterior wall 12A of the probe 11 and not enter the ports 17. The lower end 15 of probe 11 is open bottom end so that the probe 11 may drain. The upper end 13 may be an open or closed upper end. For example, when used in a vertical drain application like an air conditioning unit, the upper end 13 may be a closed end, with the lower end 15 being open and the ports 17 being at an angle along the wall 12A, 12B. When in a horizontal orientation, the probe 11 may be placed along a top or bottom (or both) of a horizontally oriented drain pipe D. In some embodiments, the probe 11 may be placed in an upper or lower half of the drain pipe D. The probe 11 may also be used in a drain pipe D that is oriented between horizontal and vertical.

The probe 11 may be in open circuit relationship with alarm 21. Alarm 21, which may be an audible alarm, includes a power source 23 and, in some embodiments, may include a wireless module 25 such as a Bluetooth, Zigbee, ZWave, or MQTT module or their equivalents. When water W backs up in a drain pipe D (or a drain, downspout, drain hose, or drain pan) being monitored by the monitor 10 and rises to a level where the water W contacts both uninsulated conductive portions 19U of probe 11, an alarm circuit 27 completes and an alarm or alert sounds. In other embodiments, the probe 11 may monitor a water level and be in closed circuit relationship with alarm 21, the alarm or alert sounding when the circuit opens. The alert may be a notice 29 sent over a network 30 to one or more computing devices 40.

The computing device 40 may include a microprocessor and associated software. The computing device 40 may be a handheld device running appropriate software to display the notice visually or play it audibly. In some embodiments, the probe 11 may be in a drain pipe D draining water from a source S and computing device 40 may be in communication with the source S may include means to shutdown the source S when there is a blockage in the drain pipe D. By way of a non-limiting example, the source may be a furnace located in an attic. The computing device 40, upon receipt of the notice 29, may shutdown the furnace and prevent any overflow.

Unlike prior art drain pan shutoffs, which shutdown the source S immediately when the shutoff gets wet, probe 11 can be wet without shutting down the source. This feature makes monitor 10 well suited to monitor an active drain and allow water or fluid to pass through and not send a notice. It also makes the monitor 10 well suited to provide redundancy and safety in applications that make use of prior art drain pan shut offs (which may fail from time to time). By way of another non-limiting example, monitor 10 may be used to monitor residential or commercial downspouts connected to, or in fluid communication with, roof gutters or drains shedding water from a flat roof. Monitor 10 can be used to monitor downspouts or drains that are located within an interior of a building or run inside walls, building columns or the like.

In some embodiments, the probe 11 may not include a housing 16. Instead, the uninsulated wires 19U are integrated into, or run along, opposite interior walls 26 of the drain, drain pipe, downspout, drain hose, or drain pan D. When in use, the drain D may be horizontally or vertically oriented or angled between horizontal and vertical. The monitor 10 may built into a pipe, hose or drain. In other words, it does not need to be a separate device but rather integrated into the construction of the pipe, hose or drain.

Where multiple drain pipes D (or drains, downspouts, or drain pans) are being monitored, each alarm and probe combination may include a unique identifier code, the notice 29 including the unique identifier so a user knows which drain pipe D is backed up. In some embodiments, two or more probes 11 may be placed along a length of a vertically oriented run of drain pipe D so that various heights or conditions may be monitored.

While embodiments of this disclosure have been described, modifications may be made by persons of ordinary skill without departing from the scope of the following claims. The elements recited in the claims are entitled to their full range of equivalents.

What is claimed is:

1. A liquid drain monitor comprising:
    a probe including
        a top end,
        an open bottom end;
        a wall connecting the top and open bottom ends and forming a hollow interior of the probe, the wall having a plurality of inclined thru ports located along its length, each inclined thru port forming a fluid passageway to the hollow interior,
        a pair of wires, each wire of the pair spaced apart from one another and having an uninsulated end located within and exposed to the hollow interior; and
    an alarm, another end of each wire of the pair connected to the alarm, the alarm and the probe being in a circuit having a first state;
    wherein when in an intended liquid drain monitor use, liquid flowing in a first direction passes along an exterior of the probe, the circuit remaining in the first state; and
    wherein when the liquid that has passed along the exterior of the probe flows in a second direction opposite the first direction and into the open bottom end of the probe and into one or more of the inclined thru ports, the circuit moves into a second state when the liquid contacts the uninsulated end each wire of the pair of wires.

2. The liquid drain blockage detector of claim 1, wherein, each inclined thru port of the plurality includes an interior end located nearer the top end of the probe than the open bottom end and an exterior end located nearer the open bottom end of the probe than the top end.

3. The liquid drain blockage detector of claim 1, wherein, the top end is an open top end.

4. The liquid drain blockage detector of claim 1, wherein, the first state of the circuit is open and the second state of the circuit is closed.

5. The liquid drain blockage detector of claim 1, further comprising at least one of a drain, drain pan, or drain pipe; the probe at least partially housed by the drain, drain pan, or drain pipe.

6. The liquid drain blockage detector of claim 5, wherein, the probe is oriented parallel to a drain flow direction of the liquid.

7. The liquid drain blockage detector of claim 6, wherein the drain flow direction is horizontal.

8. The liquid drain blockage detector of claim 6, wherein, the drain flow direction is vertical.

9. The liquid drain blockage detector of claim 1, further comprising:
    a liquid source shutoff in communication with the alarm;
    wherein, when the circuit is in the first state, the liquid source shutoff is in an open position; and
    wherein, when the circuit is in the second state, the liquid source shutoff moves to a closed position.

10. The liquid drain blockage detector of claim 1, further comprising:
    the alarm including a microprocessor.

11. The liquid drain blockage detector of claim 1, further comprising:
    the alarm including a wireless module.

12. A method of detecting blockage of a liquid drain, the method comprising:
    monitoring a drain by way of a liquid drain blockage detector, the liquid drain blockage detector residing in the drain and including
        a probe comprising
            a top end,
            an open bottom end;
            a wall connecting the top and open bottom ends and forming a hollow interior of the probe, the wall having a plurality of inclined thru ports located along its length, each inclined thru port forming a fluid passageway to the hollow interior,
            a pair of wires, each wire of the pair spaced apart from one another and having an uninsulated end located within and exposed to the hollow interior; and
        an alarm, another end of each wire of the pair connected to the alarm, the alarm and the probe being in a circuit having a first state;
    wherein, the probe is at least partially housed by the drain; and
    wherein, liquid flowing in a first direction passes along an exterior of the probe, the circuit remains in the first state; and
    wherein, when the liquid that has passed along the exterior of the probe flows in a second direction opposite the first direction and into the open bottom end of the probe and into one or more of the inclined thru ports, the circuit moves into a second state when the liquid contacts the uninsulated end each wire of the pair of wires.

13. The method of claim 12, wherein, each inclined thru port of the plurality includes an interior end located nearer the top end of the probe than the open bottom end and an exterior end located nearer the open bottom end of the probe than the top end.

14. The method of claim 12, wherein, the top end is an open top end.

15. The method of claim 12, wherein, the first state of the circuit is open and the second state of the circuit is closed.

16. The method of claim 12, further comprising at least one of a drain, drain pan, or drain pipe; the probe at least partially housed by the drain, drain pan, or drain pipe.

17. The method of claim 16, wherein, the probe is oriented parallel to a drain flow direction of the liquid.

18. The method of claim 17, wherein the drain flow direction is horizontal.

19. The method of claim 17, wherein, the drain flow direction is vertical.

20. The method of claim 12, wherein,
   a liquid source shutoff is in communication with the alarm;
   wherein, when the circuit is in the first state, the liquid source shutoff is in an open position; and
   wherein, when the circuit is in the second state, the liquid source shutoff moves to a closed position.

21. The method of claim 12, wherein, the alarm includes a microprocessor.

22. The method of claim 12, where the alarm includes a wireless module.

\* \* \* \* \*